United States Patent
Wu et al.

(10) Patent No.: US 10,521,537 B2
(45) Date of Patent: *Dec. 31, 2019

(54) METHOD AND SYSTEM OF GENERATING LAYOUT

(71) Applicant: Taiwan Semiconductor Manufacturing Company, Ltd., Hsinchu (TW)

(72) Inventors: Shien-Yang Wu, Jhudong Town (TW); Jye-Yen Cheng, Taichung (TW); Wei-Chang Kung, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 185 days.

This patent is subject to a terminal disclaimer.

(21) Appl. No.: 15/881,383

(22) Filed: Jan. 26, 2018

(65) Prior Publication Data
US 2018/0150581 A1    May 31, 2018

Related U.S. Application Data

(63) Continuation of application No. 14/482,194, filed on Sep. 10, 2014, now Pat. No. 9,892,221, which is a
(Continued)

(51) Int. Cl.
*G06F 17/50* (2006.01)
*H01L 23/525* (2006.01)

(52) U.S. Cl.
CPC ...... *G06F 17/5045* (2013.01); *H01L 23/5256* (2013.01); *H01L 23/5258* (2013.01); *H01L 2924/0002* (2013.01)

(58) Field of Classification Search
CPC ............ G06F 17/5045; H01L 23/5256; H01L 23/5258; H01L 2924/0002
(Continued)

(56) References Cited

U.S. PATENT DOCUMENTS

| | | |
|---|---|---|
| 5,936,296 A | 8/1999 | Park et al. |
| 5,961,808 A | 10/1999 | Kiyokawa |

(Continued)

FOREIGN PATENT DOCUMENTS

| | | |
|---|---|---|
| JP | 2009506521 A | 2/2009 |
| KR | 20010060043 A | 7/2001 |

(Continued)

*Primary Examiner* — Jack Chiang
*Assistant Examiner* — Brandon Bowers
(74) *Attorney, Agent, or Firm* — Slater Matsil, LLP

(57) ABSTRACT

A method of generating a layout usable for fabricating an integrated circuit is disclosed. The method includes generating a block layout layer usable in conjunction with a first conductive layout layer. The first conductive layout layer includes a fuse layout pattern, and the block layout layer includes a block layout pattern overlapping a portion of a fuse line portion of the fuse layout pattern. A second conductive layout layer is generated to replace the first conductive layout layer. The generating the second conductive layout layer includes performing an optical proximity correction (OPC) process on the first conductive layout layer except the portion of the fuse line portion of the fuse layout pattern corresponding to the block layout pattern.

19 Claims, 16 Drawing Sheets

Related U.S. Application Data continuation-in-part of application No. 12/638,903, filed on Feb. 15, 2009, now abandoned.

(60) Provisional application No. 61/154,194, filed on Feb. 20, 2009.

(58) Field of Classification Search
USPC .......................................................... 716/53
See application file for complete search history.

(56) References Cited

U.S. PATENT DOCUMENTS

| | | | |
|---|---|---|---|
| 6,021,078 A | 2/2000 | Le et al. | |
| 6,057,221 A * | 5/2000 | Bernstein | H01L 21/485 |
| | | | 438/601 |
| 6,269,745 B1 | 8/2001 | Cieplik et al. | |
| 6,271,574 B1 | 8/2001 | Delpech et al. | |
| 6,507,087 B1 | 1/2003 | Yu | |
| 6,555,458 B1 | 4/2003 | Yu | |
| 6,566,729 B1 | 5/2003 | Okada | |
| 6,753,210 B2 | 6/2004 | Jeng et al. | |
| 6,784,043 B2 | 8/2004 | Carson et al. | |
| 6,806,107 B1 * | 10/2004 | Wu | H01L 22/34 |
| | | | 257/48 |
| 6,872,648 B2 * | 3/2005 | Friese | H01L 23/5258 |
| | | | 257/E23.15 |
| 6,970,394 B2 | 11/2005 | Wu et al. | |
| 7,009,274 B2 | 3/2006 | Kim | |
| 7,263,677 B1 | 8/2007 | Teig et al. | |
| 7,263,683 B1 | 8/2007 | Capodieci | |
| 7,332,791 B2 | 2/2008 | Wu | |
| 7,398,508 B2 | 7/2008 | Shi et al. | |
| 8,681,527 B2 | 3/2014 | Obayashi | |
| 2001/0007794 A1 | 7/2001 | Kim et al. | |
| 2005/0285222 A1 | 12/2005 | Thei et al. | |
| 2006/0226507 A1 | 10/2006 | Lin et al. | |
| 2007/0023859 A1 | 2/2007 | Pitts et al. | |
| 2007/0066060 A1 | 3/2007 | Wang | |
| 2007/0252237 A1 | 11/2007 | Ko et al. | |
| 2008/0168419 A1 | 7/2008 | Burkhardt et al. | |
| 2011/0116299 A1 | 5/2011 | Obayashi | |
| 2013/0059238 A1 | 3/2013 | Kurjanowicz | |
| 2014/0217612 A1 | 8/2014 | Bao et al. | |
| 2014/0277681 A1 | 9/2014 | Chang et al. | |
| 2015/0067620 A1 | 3/2015 | Wu et al. | |

FOREIGN PATENT DOCUMENTS

| | | |
|---|---|---|
| KR | 20070105871 A | 10/2007 |
| KR | 20110001733 A | 1/2011 |

* cited by examiner

METHOD AND SYSTEM OF GENERATING LAYOUT

PRIORITY CLAIM AND CROSS-REFERENCE

The present application is a continuation of U.S. application Ser. No. 14/482,194, filed on Sep. 10, 2014, which is a continuation-in-part of U.S. application Ser. No. 12/638,903, filed Dec. 15, 2009, which claims priority of U.S. Application Ser. No. 61/154,194 filed on Feb. 20, 2009, which applications are hereby incorporated by reference herein as if reproduced in its entirety.

BACKGROUND

The present disclosure relates generally to the field of semiconductor circuits, and more particularly, to integrated circuits having fuses and systems thereof.

In the semiconductor industry, fuse elements have been widely utilized in integrated circuits for a variety of purposes, such as improving manufacturing yield or customizing a generic integrated circuit. For example, fuse elements can be used to replace defective circuits on a chip with redundant circuits on the same chip, and thus manufacturing yields can be significantly increased. Replacing defective circuits is especially useful for improving manufacturing yield of the memory chips since memory chips consist of a lot of identical memory cells and cell groups. In another example, selectively blowing fuses within an integrated circuit can be utilized to customize a generic integrated circuit design to a variety of custom uses.

BRIEF DESCRIPTION OF THE DRAWINGS

The present disclosure is best understood from the following detailed description when read with the accompanying figures. It is emphasized that various features are not drawn to scale and are used for illustration purposes only. In fact, the numbers and dimensions of the various features may be arbitrarily increased or reduced for clarity of discussion.

DETAILED DESCRIPTION

Figure 1:
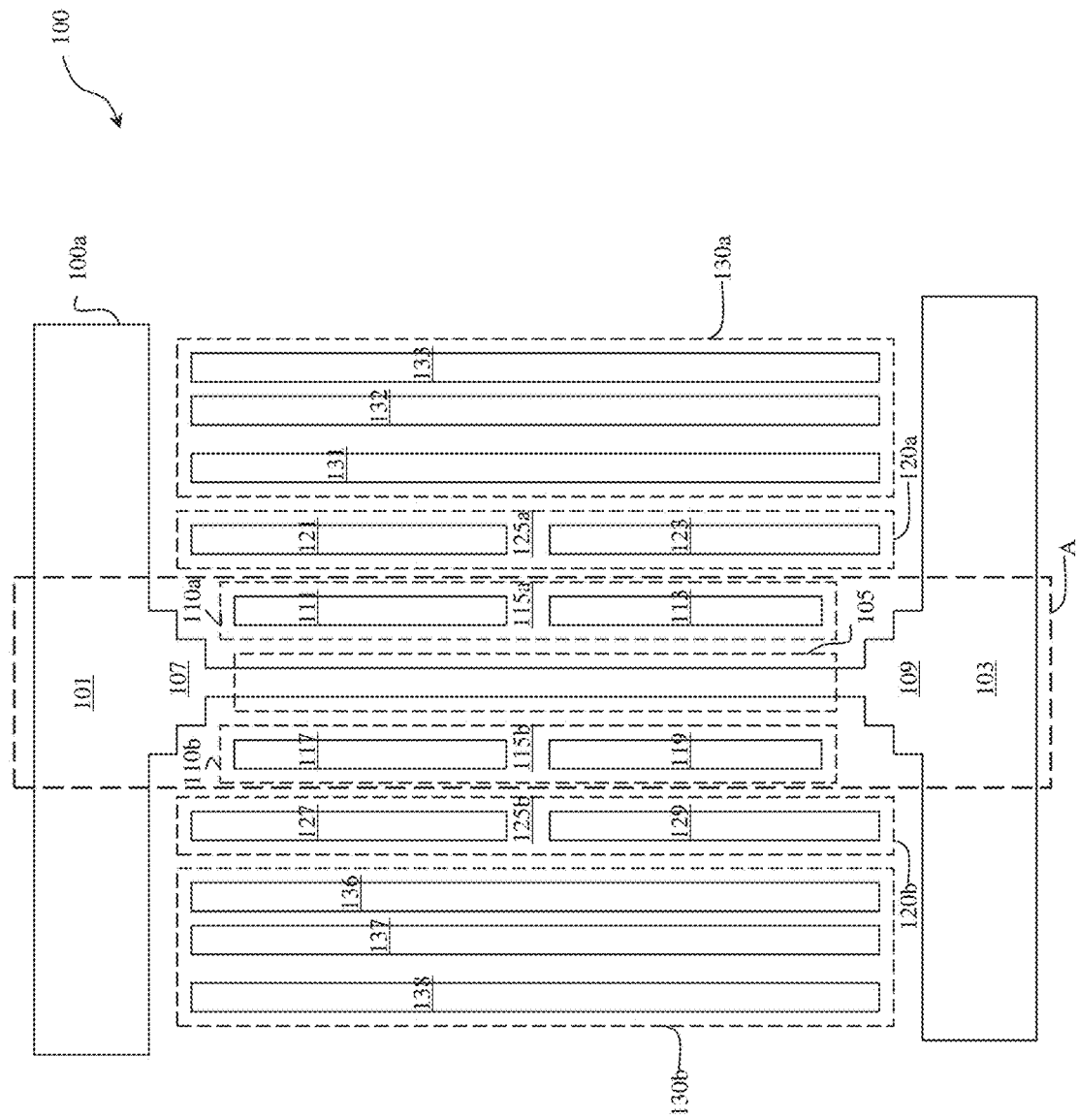
FIG. 1 is a schematic drawing illustrating an exemplary fuse of an integrated circuit and a plurality of dummy patterns adjacent thereto.

It is understood that the following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or dispositions discussed.

In general, there are many ways to disconnect fuses: disconnection carried out by the action of a laser beam (referred to as a laser fuse); or disconnection carried out by electrical destruction resulting from the production of heat (referred to as an electrical fuse, or E-fuse).

Laser programmable redundancy using laser fuses has been widely used in large-scale memory devices. However, laser repair rates in various structures such as in lower level metal layers are low and the process is complex. For example, an extra mask is needed to form an opening for laser fusing and the process has to be precisely controlled. If a laser fuse is disposed in a lower level layer deep in a chip, the opening will be deeper. The thickness of dielectric of interconnection has to be controlled precisely, which increases the complexity significantly and decreases the repairable rate.

For electrical fusing, a polysilicon strip is formed and patterned. The polysilicon strip is formed by a process forming polysilicon gates. When the complementary metal-oxide-semiconductor (CMOS) technology has advanced from the polysilicon gates to metal gates, an extra process forming the polysilicon strip is added. The extra polysilicon process increases the manufacturing costs. It is also found that a fuse programming ratio, i.e., a final resistance after fusing ($R_{fusing}$) to an initial resistance ($R_{initial}$), is about 50 or less. Such fuse programming ratio may result in an undesired failure fusing rate or repair rate.

FIG. 1 is a schematic drawing illustrating an exemplary fuse of an integrated circuit and a plurality of dummy patterns adjacent thereto. In FIG. 1, an integrated circuit 100 includes a fuse 100*a* over a substrate (not shown). The integrated circuit can include a memory circuit, an analog circuit, a digital circuit, a mixed-mode circuit, processor, other integrated circuits, and/or combinations thereof. At least a part of the circuit in the integrated circuit 100 is coupled with the fuse 100*a*. The substrate is made of semiconductor materials, such as silicon or germanium in crystal, polycrystalline, or an amorphous structure; a compound semiconductor including silicon carbide, gallium arsenic, gallium phosphide, indium phosphide, indium arsenide, and indium antimonide; an alloy semiconductor including SiGe, GaAsP, AlInAs, AlGaAs, GaInAs, GaInP, and GaInAsP; any other suitable material; or combinations thereof. In one embodiment, the alloy semiconductor substrate may have a gradient SiGe feature in which the Si and Ge composition change from one ratio at one location to another ratio at another location of the gradient SiGe feature. In another embodiment, the alloy SiGe is formed over a silicon substrate. In another embodiment, a SiGe substrate is strained. Furthermore, the semiconductor substrate may be a semiconductor on insulator, such as a silicon on insulator (SOI), or a thin film transistor (TFT). In some examples, the semiconductor substrate may include a doped epi layer or a buried layer. In other examples, the compound semiconductor substrate has a multilayer structure, or the substrate may include a multilayer compound semiconductor structure.

Referring to FIG. 1, the fuse 100a includes a first end 101, a second end 103, and a central portion 105 between the first end 101 and the second end 103. The first end 101 and the second end 103 of the fuse 100a are coupled with at least one integrated circuit. If a current flowing through the fuse 100a is high enough, the central portion 105 of the fuse 100a melts, which results in the disconnection of the integrated circuit coupled thereto. In embodiments, the fuse 100a has the same material as a metal gate of a field effect transistor (FET), e.g., copper, tungsten, titanium, tantulum, titanium nitride, tantalum nitride, nickel silicide, cobalt silicide; other proper conductive materials; and combinations thereof, a material as same as a metallic layer of interconnection, e.g., copper, aluminum oxide, aluminum, aluminum nitride, titanium, titanium nitride (TiN), tantalum, tantalum nitride, other suitable material, and/or combinations thereof, and/or other suitable metallic material. In at least one other embodiment, the fuse 100a is formed by a process forming a metal gate or a metal interconnection layer, and no extra step of forming an extra polysilicon strip for fusing being necessary.

In one of the embodiments, the integrated circuit 100 includes a first dummy patterns 110a and 110b adjacent to each side of the central portion 105 of the fuse 100a. The patterns of the fuse 100a and first dummy patterns 110a, 110b can be transferred from patterns of at least one mask layer by a photolithographic process. In some embodiments, the fuse 100a is a single line. If the width of the central portion 105 of the fuse 100a is reduced according to technology scaling without a neighboring dummy pattern, the photolithographic process may distort the pattern of the central portion 105 of the fuse 100a, resulting in unexpected variation in critical dimension of the central portion 105 of the fuse 100a. Dummy patterns of the mask layer corresponding to the first dummy patterns 110a and 110b are configured to eliminate or reduce the change in critical dimension of the central portion 105 of the fuse 100a resulting from the photolithographic process or logic operation applied through optical proximate correction (OPC). By adding dummy patterns corresponding to the first dummy patterns 110a and 110b on the mask layer, the lithographic process can better form the pattern of the central portion 105 of the fuse 100a on the substrate at the predetermined dimension.

In some of the embodiments, the first dummy pattern 110a and 110b have lines 111, 113 and 117, 119, respectively. The first dummy pattern 110a has a space 115a between the lines 111 and 113; and the first dummy pattern 110b has a space 115b between the lines 117 and 119. In some embodiments, the spaces 115a and 115b are adjacent to the central portion 105 of the fuse 100a. In other embodiments, the spaces 115a and 115b are adjacent to the center (not labeled) of the central portion 105. If a current flow melts the fuse 100a and the melted fuse material migrates to the lines 111 and/or 113, the space 115a is capable of isolating the line 111 from the line 113, keeping the path of the current flow open. The integrated circuit coupled with the fuse 100a can thus be programmed and/or operate. It is noted that the number and location of the spaces 115a and 115b shown in FIG. 1 are mere examples. One of skill in the art is able to change the number and/or modify the location to achieve a desired fuse element.

Referring to FIG. 1, in one of the embodiments, the integrated circuit 100 includes at least one second dummy pattern such as second dummy patterns 120a and 120b. The second dummy patterns 120a and 120b are disposed adjacent to the first dummy patterns 110a and 110b, respectively. As noted, the photolithographic process transferring the pattern of the fuse 100a from the mask layer to the substrate may distort the central portion 105 of the fuse 100a. Dummy patterns on the mask layer corresponding to the second dummy patterns 120a and 120b reduce the distortion as well as ensure local pattern density.

In at least one of the embodiments, the second dummy patterns 120a and 120b have lines 121, 123 and 127, 129, respectively. The second dummy pattern 120a has a space 125a between the lines 121 and 123; and the second dummy pattern 120b has a space 125b between the lines 127 and 129. The spaces 125a and 125b are adjacent to the spaces 115a and 115b of the first dummy patterns 110a and 110b, respectively. If a current flow melts the fuse 100a and the melted fuse material migrates to the lines 111 and/or 113 and further to the lines 121 and/or 123, the space 125a is capable of isolating the line 121 from the line 123, maintaining an open current flow path. The integrated circuit coupled with the fuse 100a can thus be programmed and operate. It is noted that the number and location of the spaces 125a and 125b shown in FIG. 1 are mere examples. One of skill in the art is able to change the number and/or modify the location to achieve a desired fuse element.

Referring again to FIG. 1, in yet another embodiment, the integrated circuit 100 includes at least one third dummy pattern such as third dummy patterns 130a and 130b. The third dummy patterns 130a and 130b reduce the distortion to the central portion 105 of the fuse 100a resulting from the photolithographic process as well as ensure local pattern density. In embodiments, the third dummy patterns 130a and 130b include a plurality of lines 131-133 and 136-138, respectively. The dummy patterns 130a and 130b continuously extend over the substrate. In other embodiments, the dummy patterns 130a and 130b include at least one space described above in conjunction with dummy patterns 110a and 110b.

It is noted that the positions of the spaces 115a, 115b, 125a, and 125b can be modified as long as the spaces 115a, 115b, 125a, and 125b can desirably break the current flow through the migrating fuse material. It is also noted that the patterns and numbers of the dummy patterns 110a-110b, 120a-120b, 130a-130b, and lines 111, 113, 117, 119, 121, 123, 127, 129, 131-133, and 136-138 are mere examples. The scope of the invention is not limited thereto. One of skill in the art is able to modify them to achieve a desired fuse pattern.

Figure 2:
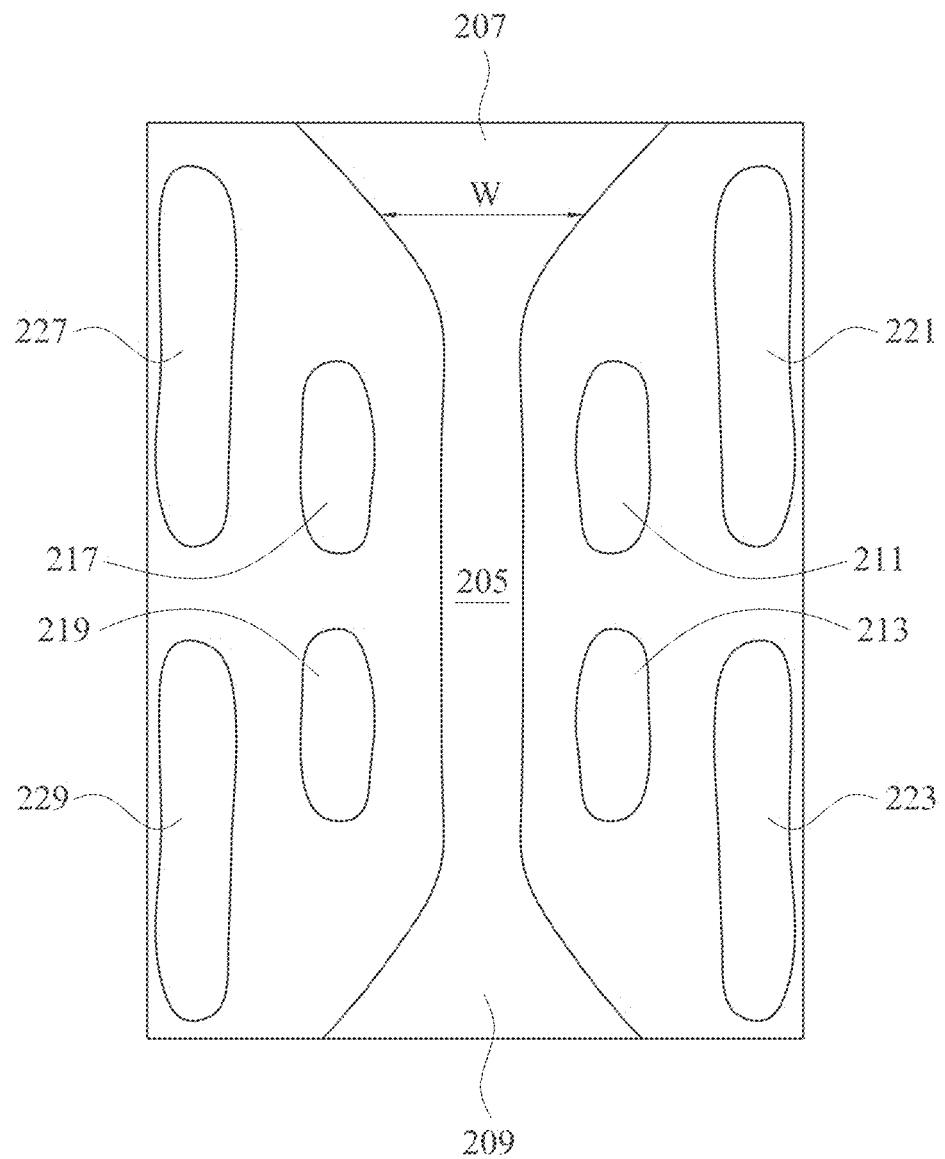
FIG. 2 is a drawing illustrating a simulation pattern corresponding to the fuse pattern of FIG. 1.

Referring again to FIG. 1, in one embodiment, the fuse 100a includes portions 107 and 109 between the first end 101 and the central portion 105 and between the second 103 and the central portion 105, respectively. As noted, the photolithographic process may distort the pattern of the central portion 105. The photolithographic process may also distort the pattern of joints between the first end 101 and the central portion 105 and between the second end 103 and the central portion 105. A pattern on the mask layer corresponding to the portion 107 is configured to eliminate or reduce the distortion at the joint of the first end 101 and the central portion 105. In some embodiments, the pattern on the mask layer corresponding to the portion 107 has a reduced width from the first end 101 to the central portion 105. The pattern on the mask layer corresponding to the portion 107 can be referred to as an optical proximate correction (OPC) technique. It is noted that the pattern of the portion 107 shown in FIG. 1 is merely illustrative. By transferring the pattern on the mask layer to the substrate, the final pattern of the portion 107 may be shown as the reference numeral 207 shown in FIG. 2. FIG. 2 is a drawing illustrating a simulation pattern corresponding to the fuse pattern of FIG. 1. Items of FIG. 2 that are the same or similar items in FIG. 1 are indicated by the corresponding reference numerals, which are reference numerals of FIG. 1 increased by 100. As shown, the final pattern of the portion 207 can have a width "w" gradually reducing from the first end (not shown in FIG. 2) to the central portion 205.

Figure 3:
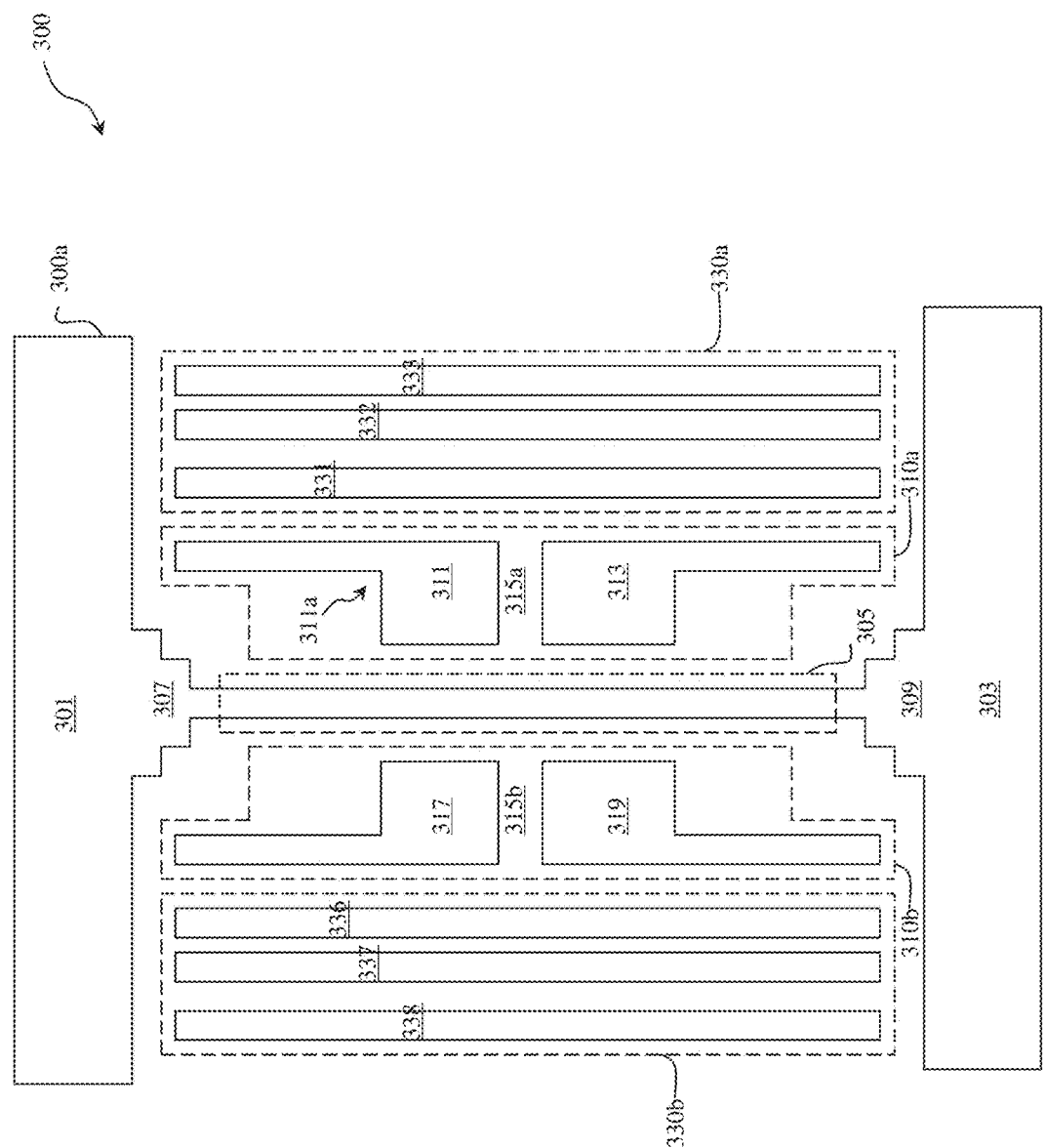
FIG. 3 is a drawing illustrating another fuse of an integrated circuit and exemplary dummy patterns adjacent thereto.
Figure 4A:
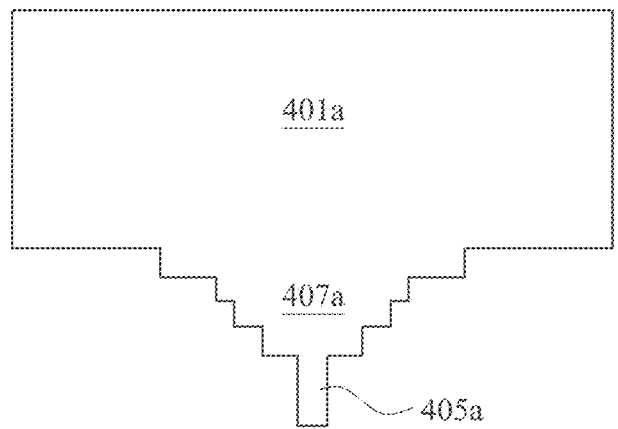
FIGS. 4A-4H are schematic drawings showing various exemplary patterns of portion between fuse ends and central portions.
Figure 4B:
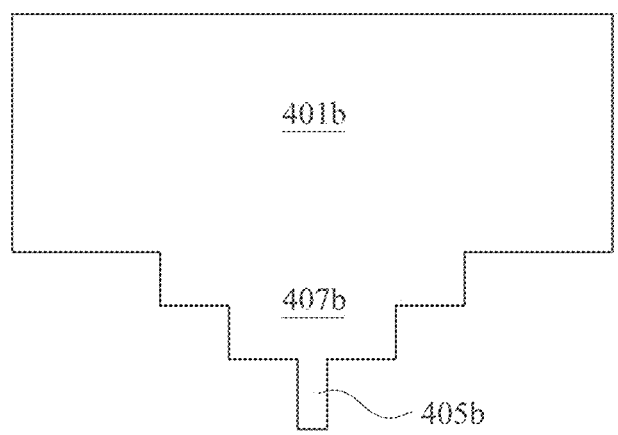
Figure 4C:
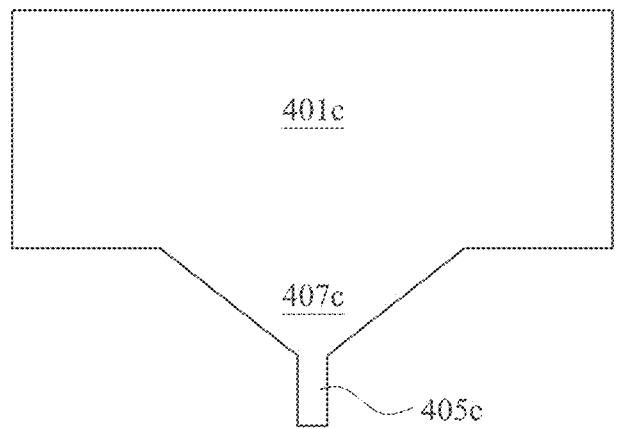
Figure 4D:
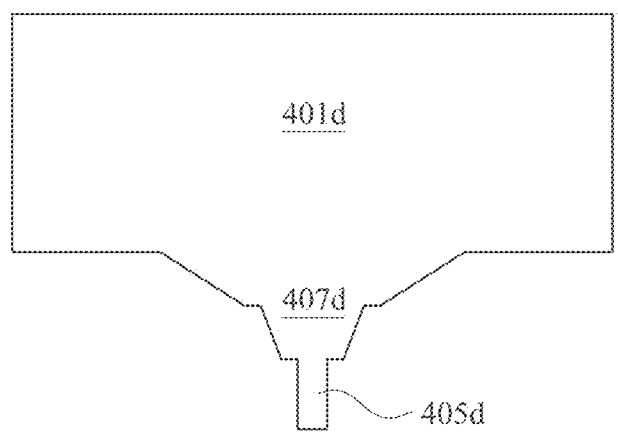
Figure 4E:
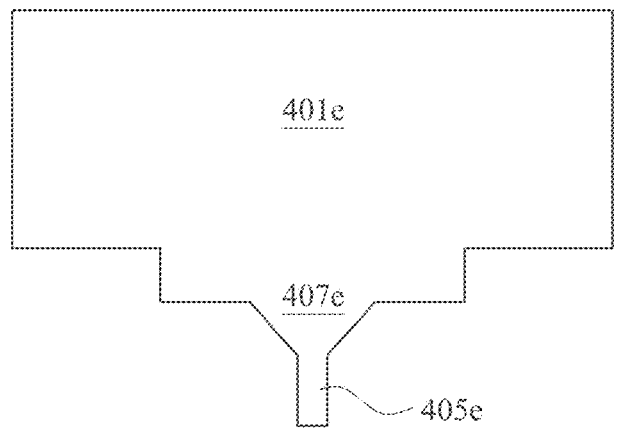
Figure 4F:
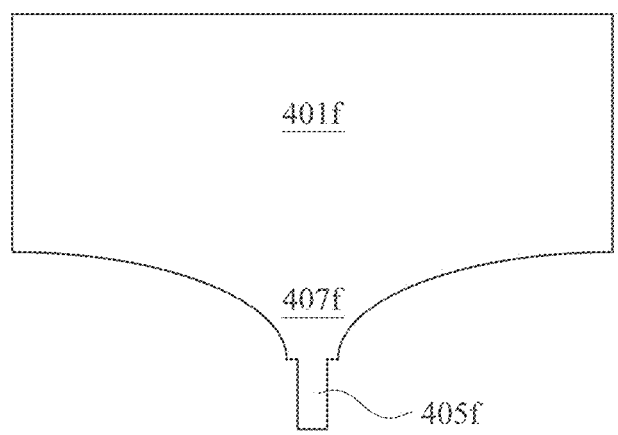
Figure 4G:
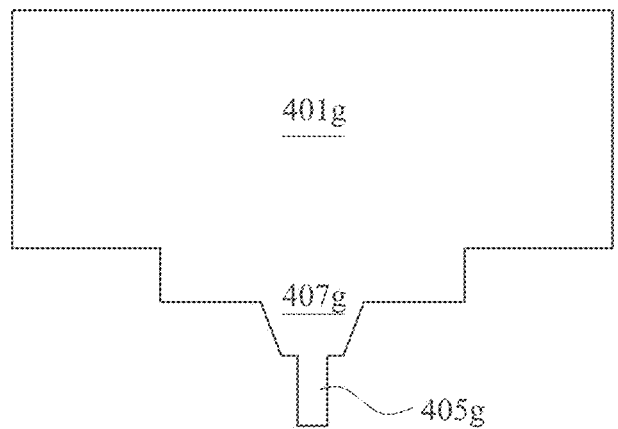
Figure 4H:
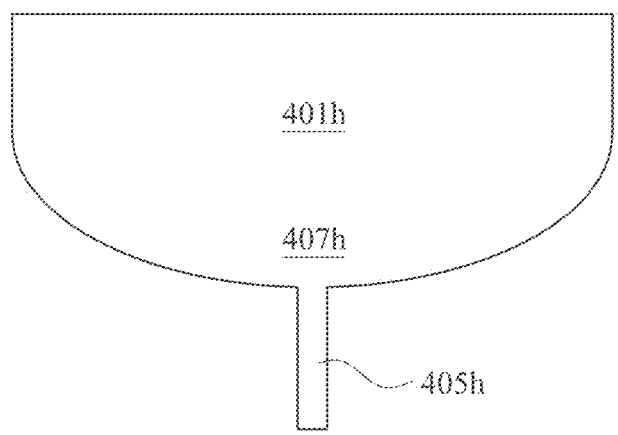

FIG. 3 is a drawing illustrating another fuse of an integrated circuit and exemplary dummy patterns adjacent thereto. Items of FIG. 3 that are the same or similar items in FIG. 1 are indicated by corresponding reference numerals, which are reference numerals of FIG. 1 increased by 200. In one of the embodiments, the first dummy pattern 310*a* includes "L" shape dummy patterns 311 and 313. Each of the L-shape dummy patterns, e.g., the dummy pattern 311, has a corner, e.g., corner 311*a*, facing the portion 307 between the first end 301 and the central portion 305. Dummy patterns on the mask layer corresponding to the L-shape dummy pattern 307 eliminate or reduce distortions to the central portion 305 and/or the portion 307 of the fuse 300*a* resulting from the photolithographic process. It is noted that the shape of the dummy patterns 310*a* and 310*b* is merely an example. One of skill in the art is able to modify the shape of the dummy pattern to achieve a desired fuse pattern.

FIGS. 4A-4H are schematic drawings showing various exemplary patterns of portion between fuse ends and central portions usable in the embodiments depicted in FIGS. 1 and 3. Items of FIGS. 4A-4H that are the same or similar items in FIG. 1 are indicated by the corresponding reference numerals, which are reference numerals of FIG. 1 increased by 300 plus an alphabet changing from "a" to "h" for each drawing, respectively. It is noted that the patterns of the portions 407*a*-407*h* shown in FIGS. 4A-4H are mere examples and may be similar to those on mask layers. The final patterns of the portions 407*a*-407*h* on substrates may be similar to the portion 207 shown in FIG. 2 and/or changed according to the patterns on the mask layer. It is noted that the patterns of the portions 407*a*-407*h* between the fuse ends and the central portions are merely examples. One of skill in the art can modify the patterns to achieve a desired final pattern.

Figure 5C:
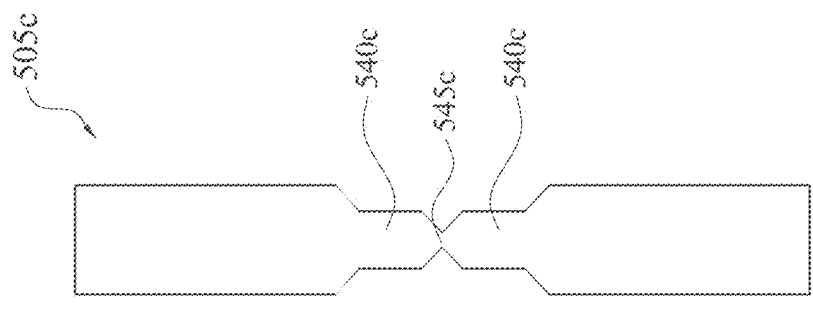
FIGS. 5A-5F are schematic drawings showing various exemplary patterns of the central portion of the fuse.
Figure 5B:
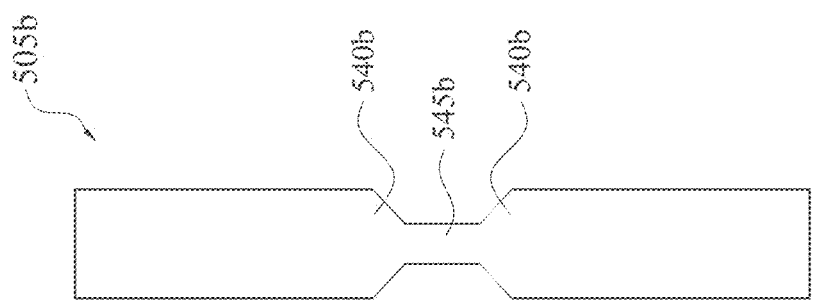
Figure 5A:
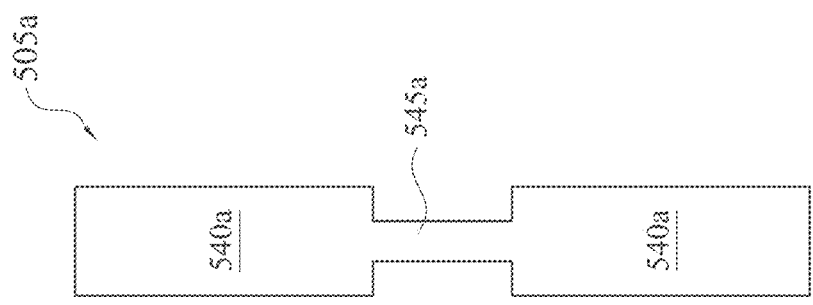
Figure 5F:
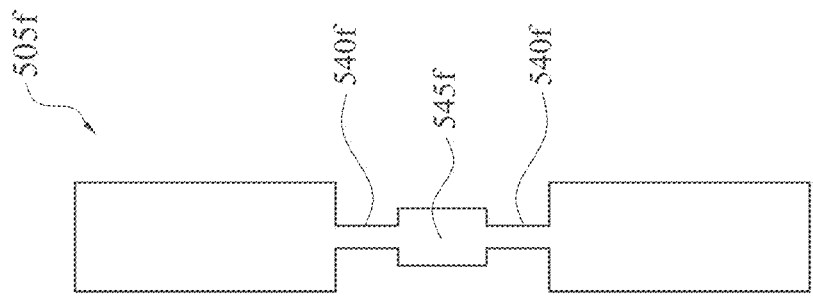
Figure 5E:
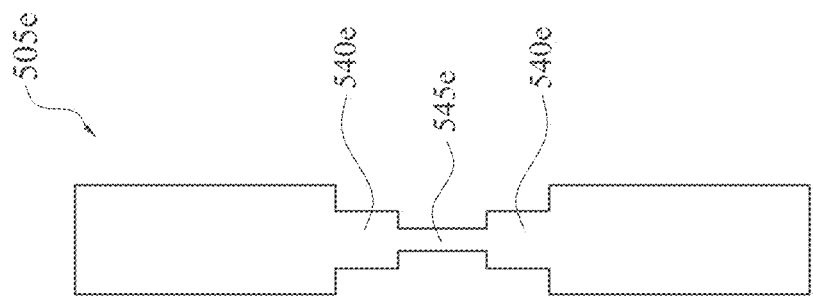
Figure 5D:
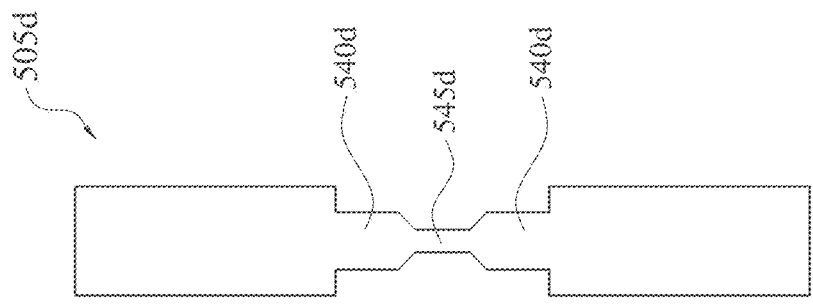

FIGS. 5A-5F are schematic drawings showing various exemplary patterns of the central portion of the fuse usable in conjunction with the embodiments depicted in FIGS. 1 and 3. Items of FIGS. 5A-5F that are the same or similar items in FIG. 1 are indicated by corresponding reference numerals, which are reference numerals of FIG. 1 increased by 400 plus an alphabet changing from "a" to "f" for each drawing, respectively. In embodiments depicted in FIGS. 5A-5E, the central portions 505*a*-505*e* have portions 545*a*-545*e* between portions 540*a*-540*e*, respectively. The widths of the portions 545*a*-545*e* are smaller than the width of one of the portions 540*a*-540*e*, respectively. The portions 545*a*-545*e* are configured to melt if a high current flows through the central portions 505*a*-505*e*. In FIG. 5F, the central portion 505*f* has portion 545*f* between portions 540*f*, wherein the width of the portion 545*f* is larger than that of each of the portions 540*f*. In one embodiment, the portions 540*f* are configured to melt if a high current flows through the central portions 505*f*. It is noted that the patterns of the central portions 505*a*-505*f* are merely examples. One of skill in the art can modify the patterns to achieve a desired central portion of the fuse.

Figure 6:
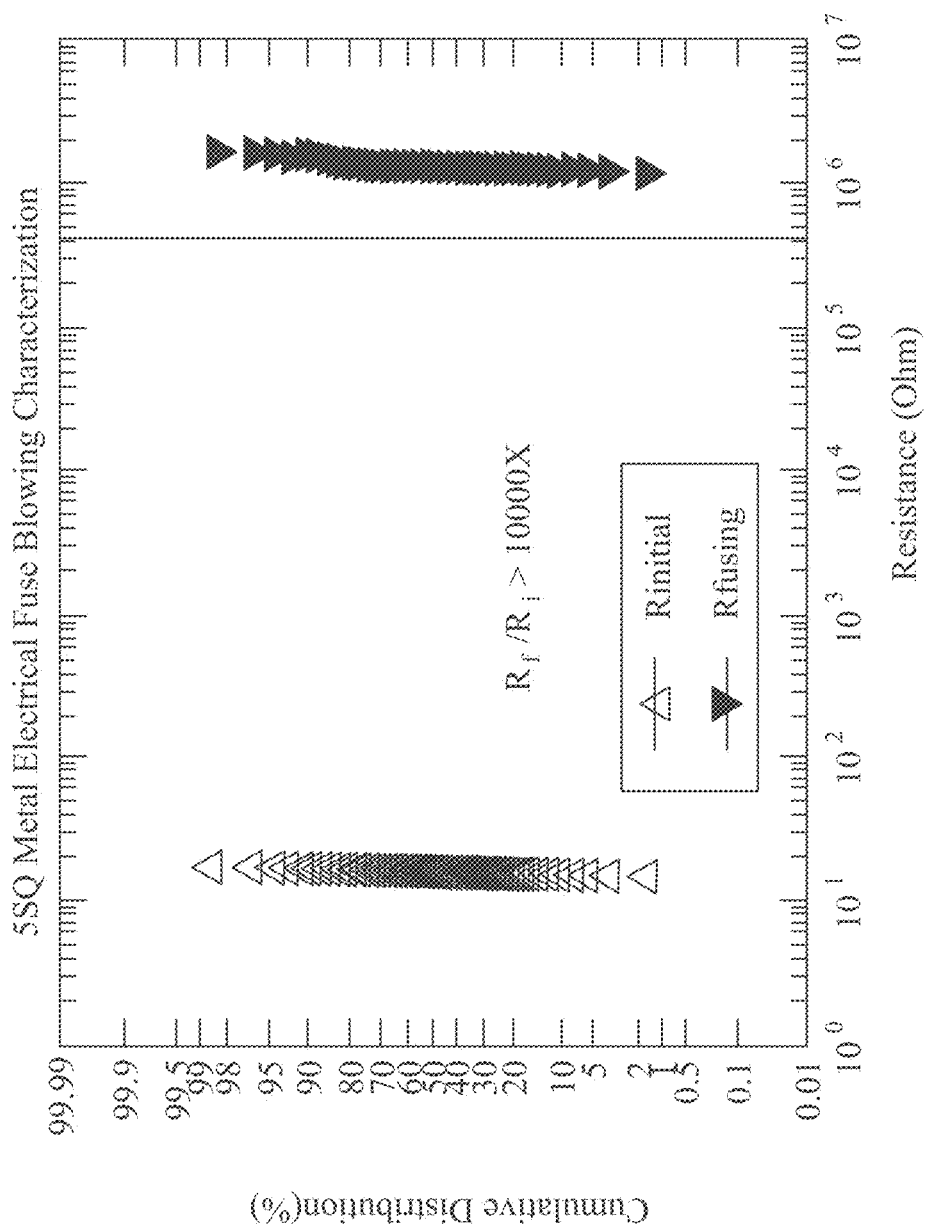
FIG. 6 is a drawing showing a relationship between resistance (Ω) and cumulative distribution (%) of exemplary fuses.

FIG. 6 is a drawing showing a relationship between resistance (Ω) and cumulative distribution (%) of exemplary fuses. As shown, a ratio of a final resistance ($R_{fusing}$) after fusing to an initial resistance ($R_{initial}$) can be about 10,000 or more. That is, the fuses described above in conjunction with FIGS. 1, 3, 4A-4H, and 5A-5F can be desirably blown if a high current flows through the fuse, and thus the integrated circuit coupled with the fuse is protected.

Figure 7:
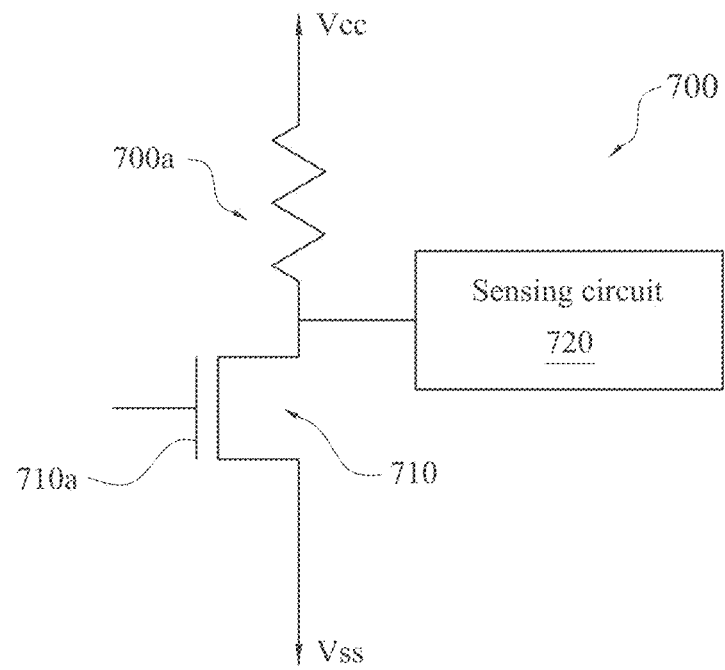
FIG. 7 is a schematic drawing showing a portion of an exemplary integrated circuit.

FIG. 7 is a schematic drawing showing a portion of an integrated circuit. In FIG. 7, in accordance with one of the embodiments, an integrated circuit 700 includes a fuse 700*a*, a metal-oxide-semiconductor field effect transistor (MOSFET) 710, and a sensing circuit 720. The fuse 700*a* is represented by a resistor symbol in the schematic diagram. The fuse 700*a* can be similar to the fuse 100*a* or 300*a* described above in conjunction with FIG. 1 or FIG. 3, respectively. A first terminal of the fuse 700*a* is coupled with a supply voltage, e.g., $V_{cc}$, and a second terminal is coupled with a drain terminal of the MOSFET 710, e.g., n-channel MOSFET. A source terminal of the MOSFET 710 is coupled with $V_{ss}$ or ground. In one of the embodiments, the MOSFET 710 is a driver device operable to supply a programming current and voltage drop across the fuse 700*a*. A control signal (not shown) is supplied to a gate terminal 710*a* of the MOSFET 710 that is operable to turn the MOSFET 710 ON or OFF. The sensing circuit 720 is coupled with the drain terminal of the MOSFET 710. The sensing circuit 720 is capable of sensing whether the fuse 700*a* is programmed. As noted, the resistance differential of the fuse 700*a* between its unprogrammed state and its programmed state is large. In one embodiment, the sensing circuit 720 senses if the fuse 700*a* is programmed by, for example, sensing a current flowing through the drain terminal of the MOSFET 710 or a voltage at the drain terminal of the MOSFET 700.

Although an n-channel MOSFET has been shown in this example, a p-channel MOSFET or another suitable driver device may be used. In embodiments, the driver device is simple in structure and can be formed by desired processing steps.

In operation, in accordance with one of the embodiments, if the fuse 700*a* is in the unprogrammed state, it exhibits a low resistance. The output voltage level at the drain terminal of the MOSFET 710 is substantially near the supply voltage level. To program the fuse 700*a*, a control signal (not shown) is supplied to the gate terminal 710*a* of the MOSFET 710 that can turn on the MOSFET 710. A voltage drop of substantially Vcc is applied across the fuse 700*a* and a current flows through the fuse 700*a*. The central portion of the fuse 700*a* is forced to bear the current flow and thus melts or is blown. A discontinuity is formed in the fuse 700*a*. The fuse 700*a* becomes an open circuit or its resistance becomes very high. In one embodiment, the sensing circuit 720 detects a voltage level approximating Vcc if the fuse 700*a* is in an unprogrammed state, and a floating or very low voltage level if the fuse 700*a* is in a programmed state.

In embodiments, the fuse 700*a* has a desired programming condition. For example, a desired programming potential and/or current can desirably convert the fuse 700*a* from an unprogrammed state with a low resistance to a programmed state with a high resistance.

Figure 8:
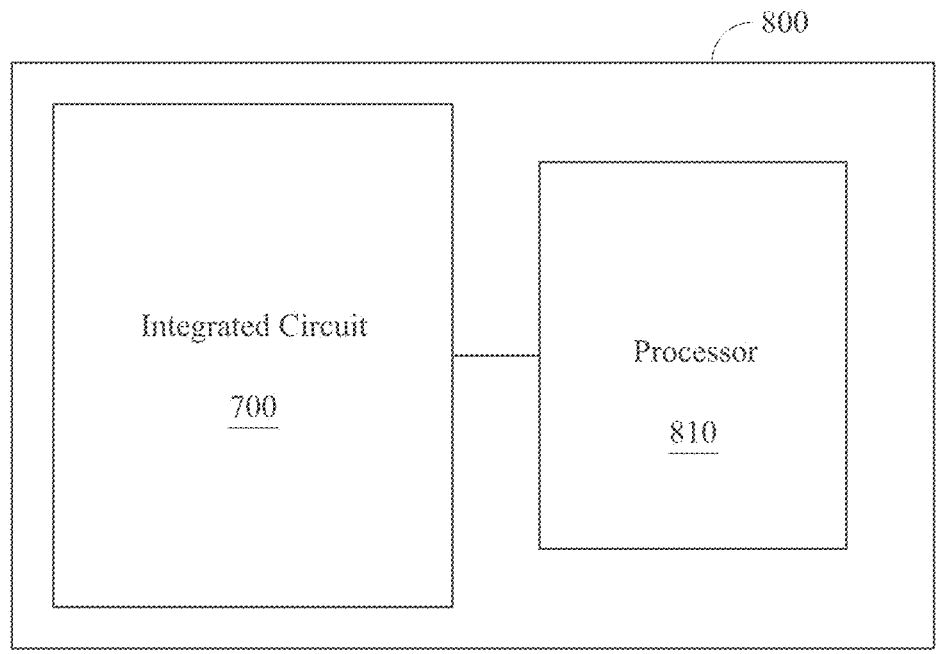
FIG. 8 is a schematic drawing showing a system including an exemplary integrated circuit.

FIG. 8 is schematic drawing showing a system including an exemplary integrated circuit. In FIG. 8, a system 800 can include a processor 810 coupled with the integrated circuit 700. The processor 810 is capable of accessing the integrated circuit 700. In embodiments, the processor 810 can be a processing unit, central processing unit, digital signal processor, or other processor.

In some embodiments, the processor 810 and the integrated circuit 700 are formed within a system that is physically and electrically coupled with a printed wiring board or printed circuit board (PCB) to form an electronic assembly. In another embodiment, the electronic assembly is part of an electronic system such as computers, wireless communication devices, computer-related peripherals, entertainment devices, or the like.

In some embodiments, the system 800 including the integrated circuit 700 provides an entire system in one IC, so-called system on a chip (SOC) or system on integrated circuit (SOIC) devices. These SOC devices provide, for example, all of the circuitry needed to implement a cell phone, personal data assistant (PDA), digital VCR, digital camcorder, digital camera, MP3 player, or the like in a single integrated circuit.

Figure 9:
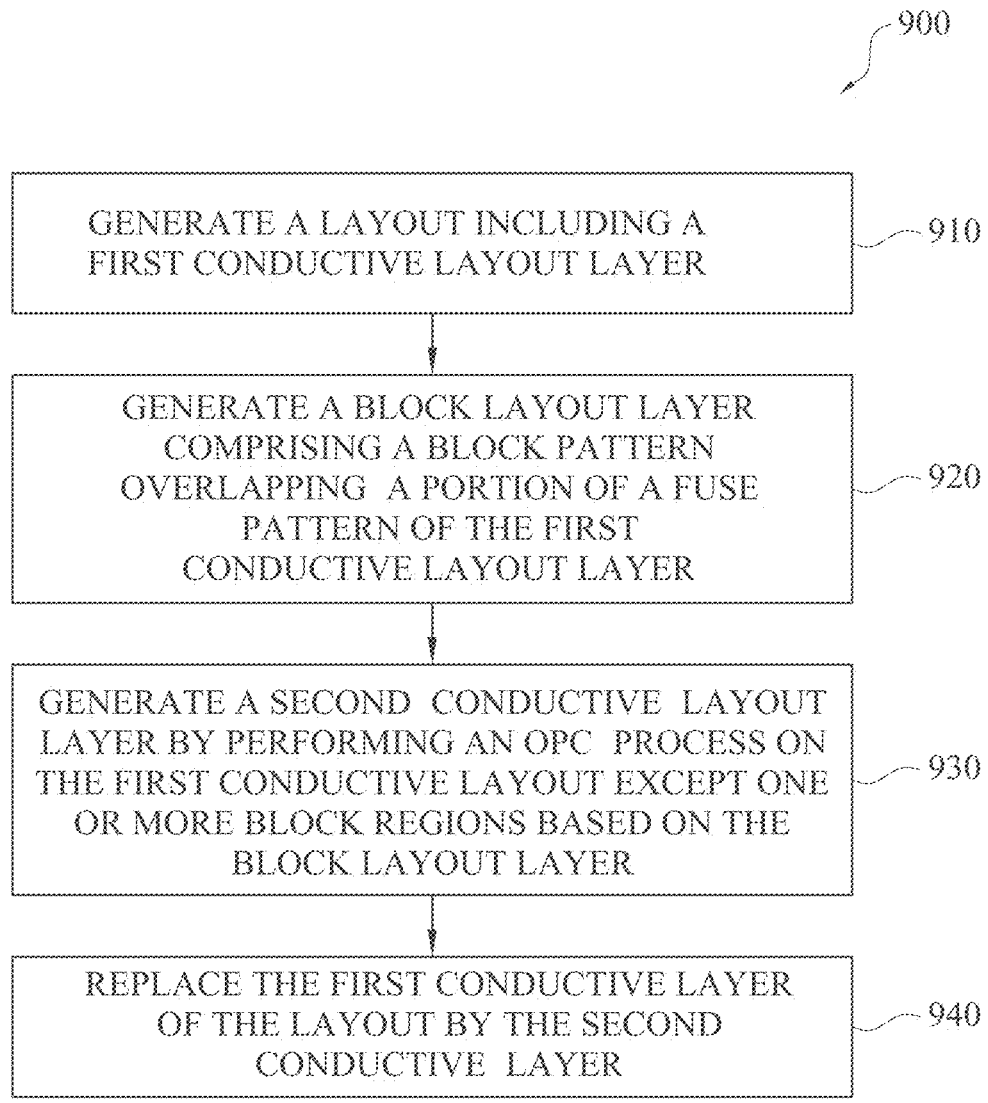
FIG. 9 is a flow chart of a method of generating a layout in accordance with some embodiments.
Figure 10A:
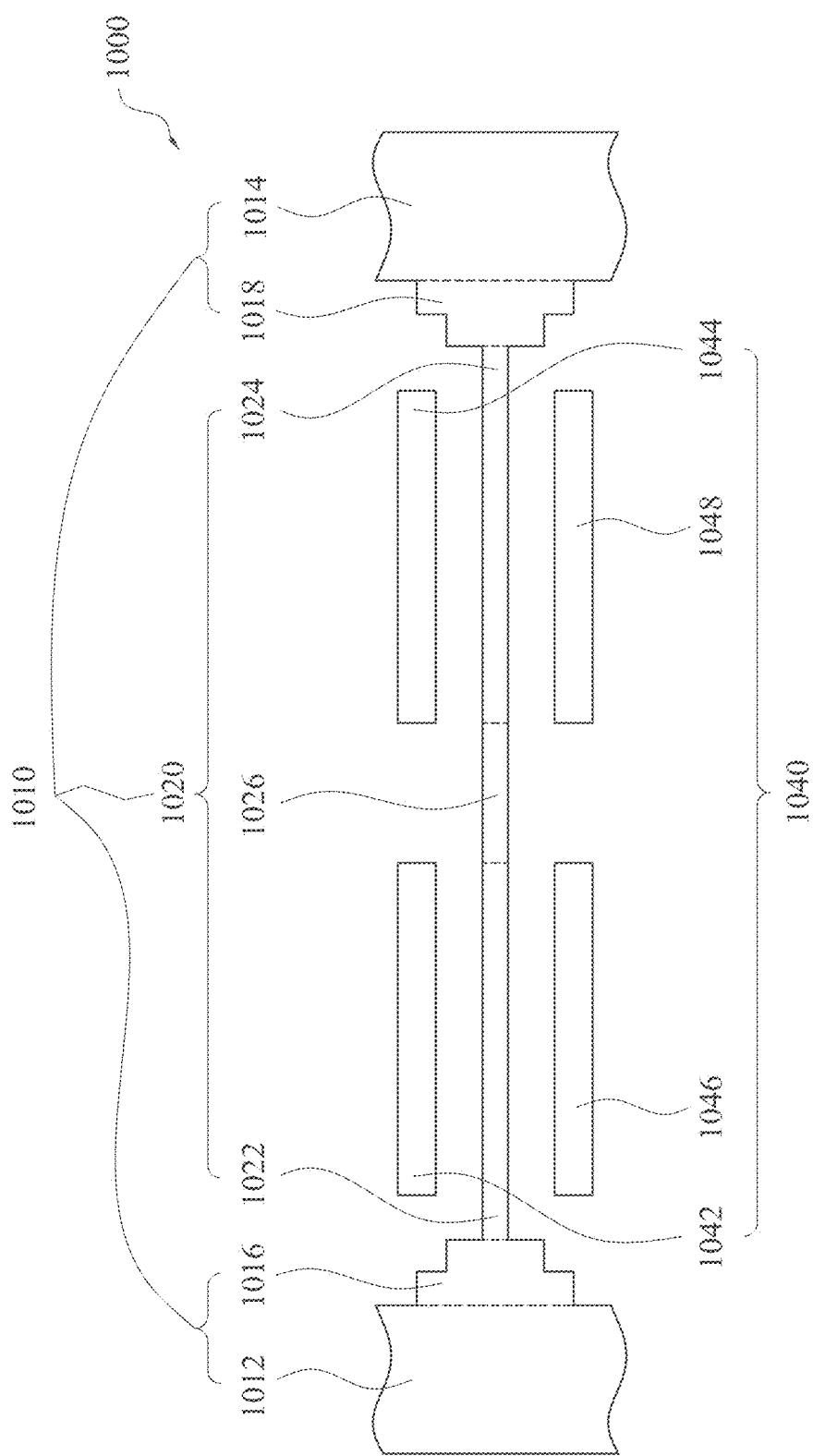
FIGS. 10A-10C are schematic drawings of a portion of a layout corresponding to region A in FIG. 1 at various processing stage in accordance with some embodiments.
Figure 10B:
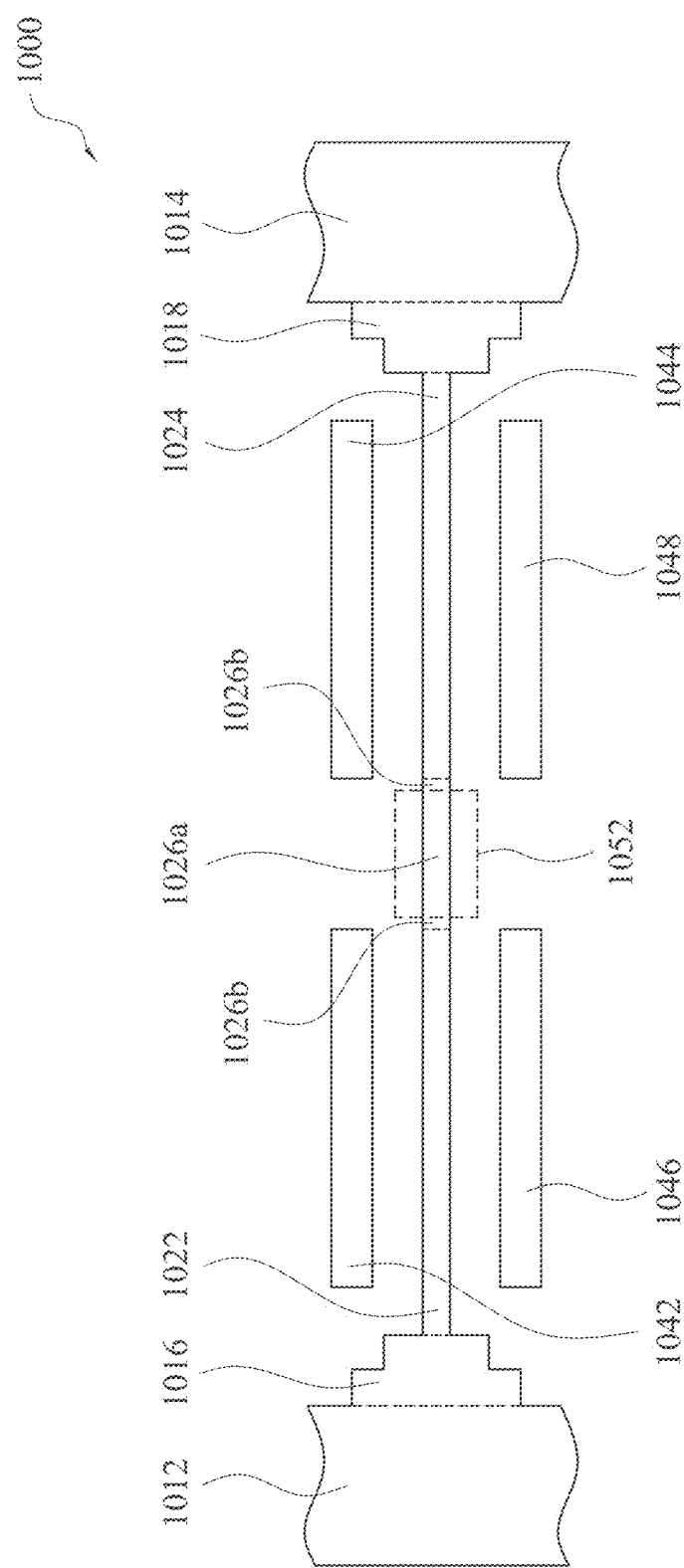
Figure 10C:
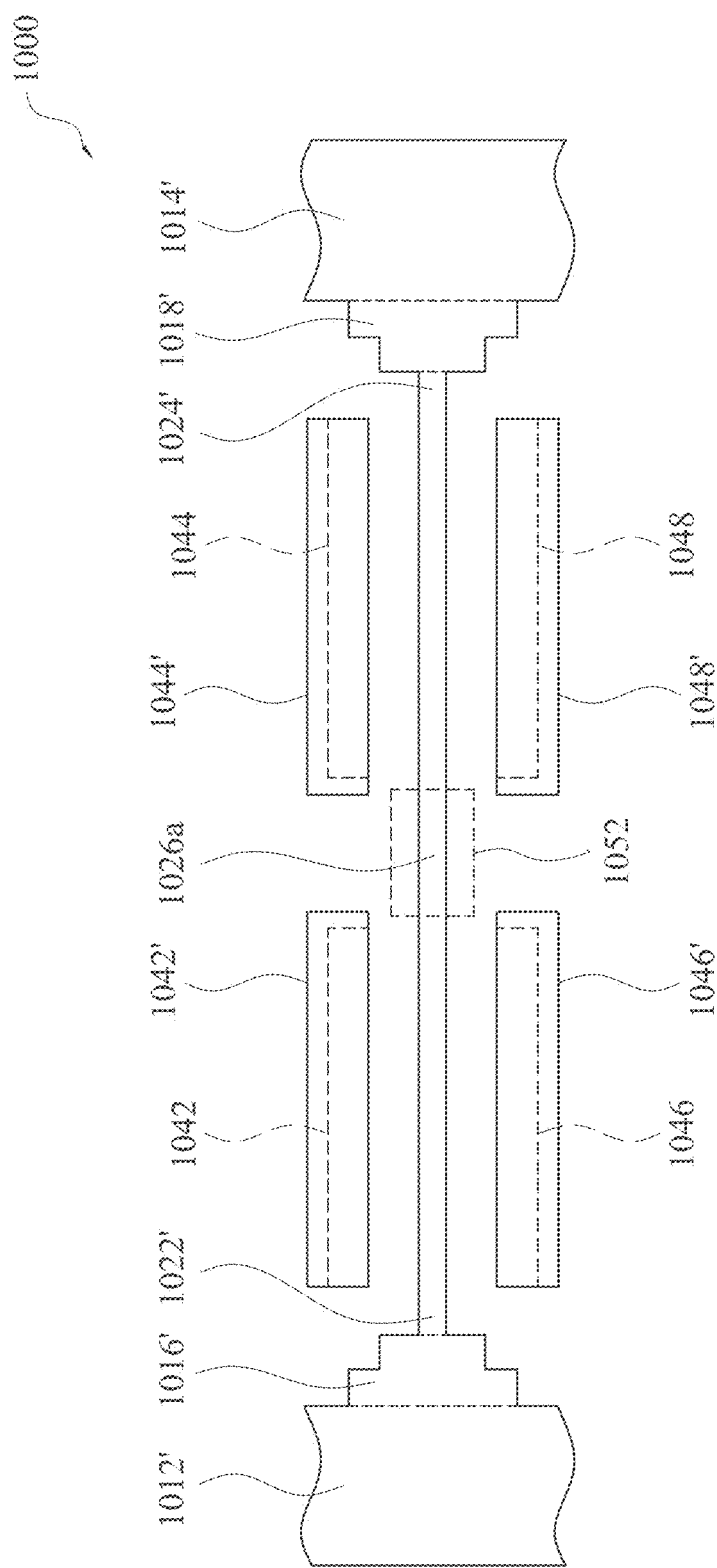

FIG. 9 is a flow chart of a method 900 of generating a layout in accordance with some embodiments. FIGS. 10A-10C are schematic drawings of a portion of a layout 1000 corresponding to region A in FIG. 1 at various processing stage in accordance with some embodiments. Method 900 will be illustrated in conjunction with the examples depicted in FIGS. 10A-10C. It is understood that additional operations may be performed before, during, and/or after the method 900 depicted in FIG. 9, and that some other processes may only be briefly described herein.

As depicted in FIGS. 9 and 10A, the method 900 begins with operation 910, where a layout 1000 usable for fabricating an integrated circuit having a fuse component as described in conjunction with FIGS. 1-8 is generated.

The layout 1000 includes a first conductive layout layer including a fuse layout pattern 1010 and a plurality of dummy layout patterns 1040. Fuse layout pattern 1010 includes a first end portion 1012, a second end portion 1014, a fuse line portion 1020 between the first end portion 1012 and the second end portion 1014, a first step-wise portion 1016 connecting the first end portion 1012 and the fuse line portion 1020, and a second step-wise portion 1018 connecting the second end portion 1014 and the fuse line portion 1020. In some embodiments, first end portion 1012 corresponds to first end 101 in FIG. 1; second end portion 1014 corresponds to second end 103; fuse line portion 1020 corresponds to central portion 105; first step-wise portion 1016 corresponds to portion 107; and second step-wise portion 1018 corresponds to portion 109.

Fuse line portion 1020 includes a first line portion 1022, a second line portion 1024, and an intermediate portion 1026 between the first line portion 1022 and the second line portion 1024. In some embodiments, the first line portion 1022 has a width the same as that of the second line portion 1024, and the intermediate portion 1026 has a width less than that of the first and second line portion 1022 and 1024. In some embodiments, intermediate portion 1026 has a shape corresponding to the shapes depicted in FIGS. 5A-5F.

The plurality of dummy layout patterns 1040 includes a first dummy layout pattern 1042 and a second dummy layout pattern 1044 adjacent to a first side of the central portion 1020, and a third dummy layout pattern 1046 and a fourth dummy layout pattern 1048 adjacent to a second side of the central portion 1040. Also, first dummy layout pattern 1042 and third dummy layout pattern extend alongside the first line portion 1022, and second dummy layout pattern 1044 and fourth dummy layout pattern 1048 extend alongside the second line portion 1044. First dummy layout pattern 1042 and second dummy layout pattern 1044 are separated by a gap; and third dummy layout pattern 1046 and fourth dummy layout pattern 1048 are separated by a gap. As such, the first, second, third, and fourth dummy layout patterns 1042-1048 are free from extending alongside the intermediate portion 1026.

In some embodiments, first dummy layout pattern 1042 corresponds to dummy pattern 111 or 311; second dummy layout pattern 1044 corresponds to dummy pattern 113 or 313; third dummy layout pattern 1046 corresponds to dummy pattern 117 or 317; and fourth dummy layout pattern 1048 corresponds to dummy pattern 119 or 319. Detail description thereof is thus omitted.

As depicted in FIGS. 9 and 10B, the method 900 proceeds to operation 920, where a block layout layer usable in conjunction with conductive layout layer 1010 is generated. The block layout layer includes one or more block layout patterns, such as block layout pattern 1052. Block layout pattern 1052 overlaps a portion 1026a of intermediate portion 1026 without overlapping portions 1026b of intermediate portion 1026. In some embodiments, block layout pattern 1052 overlaps the entirety of intermediate portion 1026. Block layout pattern 1052 is within a region of the layout 1000 that abuts, without overlaps, the first, second, third, and fourth dummy layout patterns 1042-1048. Therefore, the first, second, third, and fourth dummy layout patterns 1042-1048 are free from overlapping the block layout pattern 1052.

In some embodiments, the one or more layout patterns define blocking regions where a subsequent optical proximity correction (OPC) process is omitted. In some embodiments, the OPC process is performed by a processor of a computer, such as processor 1112 (FIG. 11) executing a set of instructions (e.g., 1114a), and the block layout pattern 152 has a size equal to or greater than a minimum size permissible by the set of instructions for OPC.

As depicted in FIGS. 9 and 10C, the method 900 proceeds to operation 930, where the subsequent OPC process is performed on the first conductive layout layer except the one or more regions corresponding to the one or more block layout patterns, and a second conductive layout layer is generated accordingly. In some embodiments, the OPC process is performed to adjust a line width of the first, second, third, or fourth dummy layout patterns 1042-1048. In some embodiments, the OPC process is performed to adjust the shape or dimension of fuse layout pattern 1010 and the plurality of dummy layout patterns 1040 except the blocked regions based on the block layout layer. The second conductive layout layer includes modified layout patterns including portions 1012', 1014', 1016', 1018', 1022', 1024', 1042', 1044', 1046', and 1048' variously correspond to portions 1012, 1014, 1016, 1018, 1022, 1024, 1042, 1044, 1046, and 1048. Moreover, portions 1022', 1024' also includes OPC-processed portions corresponding to portions 1026b. However, because portion 1026a is with the block region defined by block layout pattern 1052, the second conductive layout layer includes the portion 1026a as provided in the first conductive layout layer.

As depicted in FIG. 9, the method 900 proceeds to operation 940, where the second conductive layout layer replaces the first conductive layout layer in layout 1000.

Figure 11:
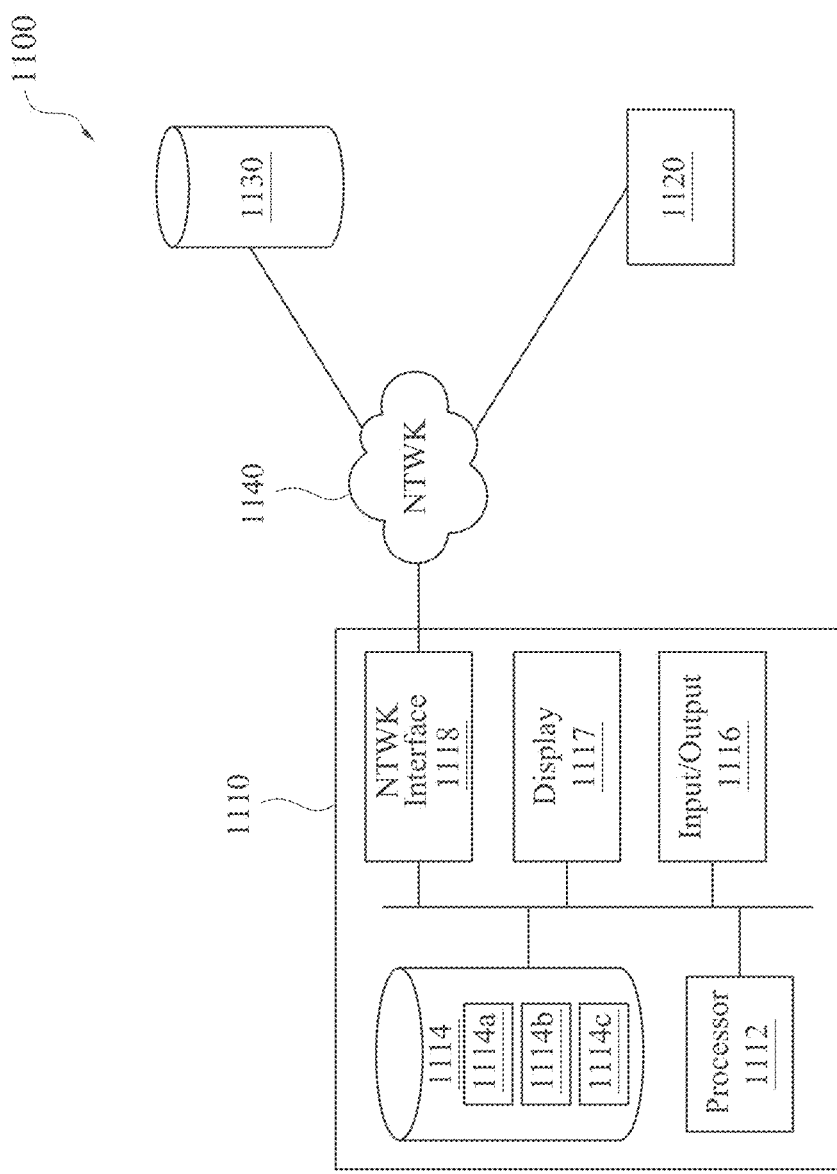
FIG. 11 is a functional block diagram of an integrated circuit designing system in accordance with one or more embodiments.

FIG. 11 is a functional block diagram of an integrated circuit designing system 1100 in accordance with one or more embodiments. Integrated circuit designing system 1100 includes a first computer system 1110, a second computer system 1120, a networked storage device 1130, and a network 1140 connecting the first computer system 1110, the second computer system 1120, and the networked storage device 1130. In some embodiments, one or more of the second computer system 1120, the storage device 1130, and the network 1140 are omitted.

The first computer system 1110 includes a hardware processor 1112 communicatively coupled with a non-transitory, computer readable storage medium 1114 encoded with, i.e., storing, a set of instructions 1114a, a layout 1114b, or any intermediate data 1114c for executing the set of instructions 1114a. The processing unit 1112 is electrically and communicatively coupled with the computer readable storage medium 1114. The processing unit 1112 is configured to execute the set of instructions 1114a encoded in the computer readable storage medium 1114 in order to cause the computer 1110 to be usable as a layout checking tool for performing a method as described in conjunction with FIG. 9.

In some embodiments, the set of instructions 1114a, the layout 1114b, or the intermediate data 1114c are stored in a non-transitory storage medium other than storage medium 1114. In some embodiments, some or all of the set of instructions 1114a, the layout 1114b, or the intermediate data 1114c are stored in a non-transitory storage medium in networked storage device 1130 or second computer system 1120. In such case, some or all of the set of instructions 1114a, the layout 1114b, or the intermediate data 1114c stored outside computer 1110 is accessible by the processing unit 1112 through the network 1140.

In some embodiments, the processor 1112 is a central processing unit (CPU), a multi-processor, a distributed processing system, an application specific integrated circuit (ASIC), and/or a suitable processing unit.

In some embodiments, the computer readable storage medium 1114 is an electronic, magnetic, optical, electromagnetic, infrared, and/or a semiconductor system (or apparatus or device). For example, the computer readable storage medium 1114 includes a semiconductor or solid-state memory, a magnetic tape, a removable computer diskette, a random access memory (RAM), a read-only memory (ROM), a rigid magnetic disk, and/or an optical disk. In some embodiments using optical disks, the computer readable storage medium 1114 includes a compact disk-read only memory (CD-ROM), a compact disk-read/write (CD-R/W), and/or a digital video disc (DVD).

The computer system 1110 includes, in at least some embodiments, an input/output interface 1116 and a display unit 1117. The input/output interface 1116 is coupled to the processor 1112 and allows the circuit designer to manipulate the first computer system 1110. In at least some embodiments, the display unit 1117 displays the status of executing the set of instructions 1114a and, in at least some embodiments, provides a Graphical User Interface (GUI). In at least some embodiments, the display unit 1117 displays the status of executing the set of instructions 1114a in a real time manner. In at least some embodiments, the input/output interface 1116 and the display 1117 allow an operator to operate the computer system 1110 in an interactive manner.

In at least some embodiments, the computer system 1100 also includes a network interface 1118 coupled to the processor 1112. The network interface 1118 allows the computer system 1110 to communicate with the network 1140, to which one or more other computer systems are connected. The network interface includes wireless network interfaces such as BLUETOOTH, WIFI, WIMAX, GPRS, or WCDMA; or wired network interface such as ETHERNET, USB, or IEEE-1394.

In accordance with one embodiment, a method of generating a layout usable for fabricating an integrated circuit is disclosed. The method includes generating a block layout layer usable in conjunction with a first conductive layout layer. The first conductive layout layer includes a fuse layout pattern, and the block layout layer includes a block layout pattern overlapping a portion of a fuse line portion of the fuse layout pattern. A second conductive layout layer is generated to replace the first conductive layout layer. The generating the second conductive layout layer includes performing an optical proximity correction (OPC) process on the first conductive layout layer except the portion of the fuse line portion of the fuse layout pattern corresponding to the block layout pattern.

In accordance with another embodiment, a method of generating a layout usable for fabricating an integrated circuit is disclosed. The method includes generating a block layout layer usable in conjunction with a first conductive layout layer. The first conductive layout layer includes a fuse layout pattern, a first dummy layout pattern, a second dummy layout pattern, a third dummy layout pattern, and a fourth dummy layout pattern. The fuse layout pattern includes a first end portion, a second end portion, and a central portion between the first end portion and the second end portion. The first dummy layout pattern is adjacent to a first side of the central portion of the fuse layout pattern. The second dummy layout pattern is adjacent to the first side of the central portion of the fuse layout pattern, and the first dummy layout pattern and the second dummy layout pattern are separated by a first gap. The third dummy layout pattern is adjacent to a second side of the central portion of the fuse layout pattern. The fourth dummy layout pattern is adjacent to the second side of the central portion of the fuse layout pattern, and the third dummy layout pattern and the fourth dummy layout pattern are separated by a second gap. The block layout layer includes one or more block layout patterns, and one of the one or more block layout patterns overlaps a portion of the central portion of the fuse layout pattern and within a region of the layout. The region abuts, without overlaps, the first, second, third, and fourth dummy layout patterns. The method also includes generating a second conductive layout layer to replace the first conductive layout layer. The generating the second conductive layout layer includes performing an optical proximity correction (OPC) process on the first conductive layout layer except one or more regions corresponding to the one or more block layout patterns.

In accordance with another embodiment, an integrated circuit designing system includes a non-transitory storage medium encoded with a set of instructions and a hardware processor communicatively coupled with the non-transitory storage medium. The processor is configured to execute the set of instruction to generate a block layout layer usable in conjunction with a first conductive layout layer and to perform an optical proximity correction (OPC) process. The first conductive layout layer includes a fuse layout pattern, and the block layout layer includes a block layout pattern overlapping a portion of a fuse line portion of the fuse layout pattern. The OPC process is performed on the first conductive layout layer except the portion of the fuse line portion of the fuse layout pattern corresponding to the block layout pattern, thereby generating a second conductive layout layer to replace the first conductive layout layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming an integrated circuit, the method comprising:
    disposing a fuse over a substrate, the fuse having a first end, a second end, a central portion between the first end and the second end, a first portion of the fuse adjacent to the first end and connecting the first end to the central portion, and a second portion of the fuse adjacent to the second end and connecting the second end to the central portion;
    disposing a first dummy pattern adjacent to a side of the central portion of the fuse, the first dummy pattern being bounded by the first end of the fuse and the second end of the fuse, the first dummy pattern comprising a first line and a second line physically separated from the first line; and
    disposing a second dummy pattern adjacent to the first dummy pattern, the second dummy pattern being bounded by the first end of the fuse and the second end of the fuse, wherein the first dummy pattern is disposed between the central portion of the fuse and the second dummy pattern;
    wherein the central portion includes:
    a first portion of the central portion; and
    two second portions of the central portion, the two second portions of the central portion sandwiching the first portion of the central portion, and a width of the first portion of the central portion being larger than respective widths of the two second portions of the central portion wherein a configuration of the fuse, the first dummy pattern, and the second dummy pattern is defined in a layout file, the method further comprising:
    generating the layout file, the layout file comprising a first conductive layout layer, the first conductive layout layer comprising a fuse layout pattern, the fuse layout pattern including a fuse line portion corresponding to the central portion of the fuse;
    generating a block layout layer in the layout file, the block layout layer at least partially overlapping the first conductive layout layer the block layout layer comprising a block layout pattern overlapping a portion of the fuse line portion of the fuse layout pattern;
    generating a second conductive layout layer, the generating the second conductive layout layer comprising performing an optical proximity correction (OPC) process on the first conductive layout layer except the portion of the fuse line portion of the fuse layout pattern corresponding to the block layout pattern; and
    replacing, in the layout file, the first conductive layout layer with the second conductive layout layer.

2. The method of claim 1, wherein the first portion of the fuse comprises:
    a step-wise edge or a tapered edge connecting the first end and the central portion;
    a first width at the first end; and
    a second width at the central portion, the first width being greater than the second width.

3. The method of claim 1, wherein the block layout layer overlaps the portion of the fuse line portion overlapped by the block layout pattern corresponds to the first portion of the central portion of the fuse.

4. The method of claim 1, wherein the two second portions of the central portion of the fuse has a same width and is symmetrically disposed around the first portion of the central portion.

5. The method of claim 1 further comprising disposing a third dummy pattern adjacent to a second side of the central portion of the fuse opposite the first dummy pattern, the third dummy pattern being bounded by the first end of the fuse and the second end of the fuse, the third dummy pattern comprising a third line and a fourth line physically separated from the third line.

6. The method of claim 5, wherein at least one of the first line, second line, third line, or fourth line has an "L" shape, and wherein an inner corner of the "L" shape pattern faces the first end of the fuse or the second end of the fuse.

7. The method of claim 5 further comprising disposing a fourth dummy pattern adjacent to the third dummy pattern, the fourth dummy pattern being bounded by the first end of the fuse and the second end of the fuse, wherein the third dummy pattern is disposed between the central portion of the fuse and the fourth dummy pattern.

8. The method of claim 1, wherein a separation between of the first line of the first dummy pattern and the second line of the second dummy pattern is disposed adjacent the first portion of the central portion.

9. A method of forming an integrated circuit, the method comprising:
    disposing a fuse over a substrate, the fuse having a first end, a second end, a central portion between the first end and the second end, a first portion of the fuse adjacent to the first end and connecting the first end and the central portion, and a second portion of the fuse adjacent to the second end and connecting the second end and the central portion, wherein the fuse has a first width at the first end and a second width at the central portion, the first width being greater than the second width;
    disposing a first dummy pattern adjacent to the central portion of the fuse, the first dummy pattern being bounded by the first end of the fuse and the second end of the fuse, the first dummy pattern comprising a first line, a second line, and a space separating the first line and the second line, wherein the first line and the second line each comprise an "L" shape having a longer edge and a shorter edge opposite the longer edge, and wherein the shorter edge faces the central portion of the fuse; and
    disposing a second dummy pattern adjacent to the first dummy pattern, the second dummy pattern being bounded by the first end of the fuse and the second end of the fuse, wherein the first dummy pattern is disposed between the central portion of the fuse and the second dummy pattern, and wherein a configuration of the fuse, the first dummy pattern, and the second dummy pattern is defined in a layout file, the method further comprising:
    generating the layout file, the layout file comprising a first conductive layout layer, the first conductive layout layer comprising a fuse layout pattern, the fuse layout pattern including a fuse line portion corresponding to the central portion of the fuse;

generating a block layout layer in the layout file, the block layout layer at least partially overlapping the first conductive layout layer the block layout layer comprising a block layout pattern overlapping a portion of the fuse line portion of the fuse layout pattern;

generating a second conductive layout layer, the generating the second conductive layout layer comprising performing an optical proximity correction (OPC) process on the first conductive layout layer except the portion of the fuse line portion of the fuse layout pattern corresponding to the block layout pattern; and replacing, in the layout file, the first conductive layout layer with the second conductive layout layer.

10. A method of claim 9, wherein the first portion of the fuse comprises a step-wise edge or a tapered edge connecting the first end and the central portion.

11. The method of claim 9, wherein the second portion of the fuse comprises a step-wise edge or tapered edge connecting the second end and the central portion.

12. The method of claim 9, wherein the first portion of the fuse has a same width as the second portion of the fuse.

13. The method of claim 9, wherein the central portion of the fuse has a first portion of the central portion having a first width, a second portion of the central portion have a second width, and a third portion of the central portion having a third width, the second portion of the central portion being disposed between the first portion of the central portion and the third portion of the central portion, the first width and the third width each being greater than the second width.

14. The method of claim 13, wherein the central portion of the fuse further has a fourth portion of the central portion having a fourth width, the fourth portion of the central portion being disposed between the first portion of the central portion and the third portion of the central portion, the fourth width being less than the first width and greater than the third width.

15. The method of claim 9, wherein the central portion of the fuse has a first portion of the central portion having a first width, a second portion of the central portion have a second width, and a third portion of the central portion having a third width, the second portion of the central portion being disposed between the first portion of the central portion and the third portion of the central portion, the first width and the third width each being less than the second width.

16. The method of claim 15, wherein the central portion of the fuse further has a fourth portion of the central portion having a fourth width, the fourth portion of the central portion being disposed between the first portion of the central portion and the third portion of the central portion, the fourth width being less than the first width and the third width.

17. A method comprising:
disposing a first conductive layer over a substrate, the first conductive layer comprises:
a fuse comprising:
a first end;
a first end portion;
a central portion connecting the first end portion to a second end portion, wherein the first end portion comprises a step-wise edge or a tapered edge connecting the first end and the central portion, wherein a first width of the first end portion at the first end is wider than and a second width of the first end portion at the central portion;
the second end portion, wherein the first end portion and the second end portion are symmetrically disposed around the central portion; and
a second end;
a first dummy conductive pattern adjacent to a first side of the central portion of the fuse layout pattern;
a second dummy conductive pattern adjacent to the first side of the central portion of the fuse layout pattern, the first dummy layout pattern and the second dummy layout pattern being physically separated;
a third dummy conductive pattern adjacent to a second side of the central portion of the fuse layout pattern; and
a fourth dummy conductive pattern adjacent to the second side of the central portion of the fuse layout pattern, the third dummy layout pattern and the fourth dummy layout pattern being physically separated, wherein a configuration of the fuse, the first dummy pattern, and the second dummy pattern is defined in a layout file;

generating the layout file, the layout file comprising a first conductive layout layer, the first conductive layout layer comprising a fuse layout pattern, the fuse layout pattern including a fuse line portion corresponding to the central portion of the fuse;

generating a block layout layer in the layout file, the block layout layer at least partially overlapping the first conductive layout layer the block layout layer comprising a block layout pattern overlapping a portion of the fuse line portion of the fuse layout pattern;

generating a second conductive layout layer, the generating the second conductive layout layer comprising performing an optical proximity correction (OPC) process on the first conductive layout layer except the portion of the fuse line portion of the fuse layout pattern corresponding to the block layout pattern; and replacing, in the layout file, the first conductive layout layer with the second conductive layout layer.

18. The method of claim 17, wherein the first dummy conductive has an "L" shape having a longer edge and a shorter edge opposite the longer edge, and wherein the shorter edge faces the central portion of the fuse.

19. The method of claim 17, wherein a line extending through a central of the central portion of the fuse further extends through an area where the first dummy conductive pattern is physically separated from the second dummy conductive pattern, the line being perpendicular to a lengthwise axis of the central portion of the fuse.

* * * * *